(12) United States Patent
Suhara et al.

(10) Patent No.: US 6,437,333 B1
(45) Date of Patent: Aug. 20, 2002

(54) HOLDING APPARATUS, TRANSFERRING APPARATUS, IMAGE TAKING SYSTEM, AND IMAGE TAKING METHOD

(75) Inventors: Shinsuke Suhara, Kariya; Hiroshi Katsumi, Chiryu; Jiro Kodama, Nagoya; Noriaki Iwaki, Hekinan, all of (JP)

(73) Assignee: Fuji Machine Mfg. Co., Ltd., Aichi-ken (JP)

( * ) Notice: Subject to any disclaimer, the term of this patent is extended or adjusted under 35 U.S.C. 154(b) by 0 days.

(21) Appl. No.: 09/478,912

(22) Filed: Jan. 7, 2000

(30) Foreign Application Priority Data

Jan. 28, 1999 (JP) ............................................. 11-020496

(51) Int. Cl.[7] ...................... G01N 21/00; G01B 11/00; H05K 13/08
(52) U.S. Cl. ............................ 250/341.1; 250/341.7; 356/375
(58) Field of Search .................... 250/341.1, 339.01, 250/341.7; 356/375

(56) References Cited

U.S. PATENT DOCUMENTS

| | | | | |
|---|---|---|---|---|
| 4,628,464 A | * | 12/1986 | McConnell | 364/513 |
| 4,793,707 A | * | 12/1988 | Hata et al. | 356/375 |
| 4,867,569 A | * | 9/1989 | Mohara | 356/375 |
| 4,941,256 A | * | 7/1990 | Capson et al. | 29/833 |
| 4,951,383 A | * | 8/1990 | Amao et al. | 29/721 |
| 5,012,115 A | | 4/1991 | Asai et al. | |
| 5,214,841 A | | 6/1993 | Howard et al. | |
| 5,519,495 A | * | 5/1996 | Kawaguchi | 356/375 |
| 5,692,292 A | * | 12/1997 | Asai et al. | 29/740 |

FOREIGN PATENT DOCUMENTS

| | | | |
|---|---|---|---|
| EP | 0 322 569 | 11/1988 | |
| JP | A 63-54000 | 3/1988 | |
| JP | A 4-320906 | 11/1992 | |
| JP | 05-198996 | * 8/1993 | .......... H05K/13/04 |
| JP | A 6-296093 | 10/1994 | |
| JP | Y2 7-920 | 1/1995 | |
| JP | 07126036 | 5/1995 | |
| JP | A 7-326894 | 12/1995 | |
| JP | A 8-78882 | 3/1996 | |
| JP | 10093300 | 4/1998 | |

* cited by examiner

Primary Examiner—Constantine Hannaher
Assistant Examiner—Albert Gagliardi
(74) Attorney, Agent, or Firm—Oliff & Berridge, PLC

(57) ABSTRACT

A holding apparatus including a suction nozzle which applies a negative pressure to a back surface of an object and thereby holds the object, a front-surface lighting device which emits a first visible light toward a front surface of the object held by the suction nozzle and thereby lights the front surface, and a back-surface lighting device which lights the back surface of the object held by the suction nozzle and which includes a light emitting plate which is provided around a base portion of the suction nozzle and emits a second light from a light emitting surface thereof facing a side of a free end of the suction nozzle that holds the object; and a dark infrared-ray transmitting filter which is dark, covers the light emitting surface of the light emitting plate, and transmits infrared rays of the second light.

17 Claims, 6 Drawing Sheets

HOLDING APPARATUS, TRANSFERRING APPARATUS, IMAGE TAKING SYSTEM, AND IMAGE TAKING METHOD

BACKGROUND OF THE INVENTION

1. Field of the Invention

The present invention relates to a holding apparatus of r holding an object such as an electric component (e.g., an electronic component), a transferring apparatus including the holding apparatus, and an image taking system and an image taking method each for taking an image of an object held by a holding device, and relates particularly to the art of lighting an object.

2. Related Art Statement

The above-indicated holding apparatus , a transferring apparatus, an image taking system, and an image taking method are employed by, e.g. , an electric-component mounting system which mounts an electric component on a printed circuit board ("PCB"). In the electric-component mounting system, the holding apparatus receives an electric component from an electric-component supplying device and mounts the component at a predetermined position on the PCB. Even if the current X-direction and Y-direction positions of the component held by the holding apparatus are deviated from respective reference positions, the component can be accurately mounted at the predetermined position on the PCB, by moving the holding apparatus to a corrected or modified position deviated from the predetermined position by respective distances between the X-direction and Y-direction positions of the component and the corresponding reference positions. To this end, it is needed to measure the respective distances between the X-direction and Y-direction positions of the component held by the holding apparatus and the corresponding reference positions. In addition, in some cases, it is needed to read characters and/or a bar code affixed to the component and judge of what sort the component is based on the read characters and/or bar code. To these ends, it is widely practiced that an image taking device takes an image of the component. Depending upon respective shapes of different sorts of electric components and/or different purposes of image taking, a silhouette image of each component is preferably needed in some cases, and a front-surface image of each component is preferably needed in other cases. To take a silhouette image of an electric component held by the holding apparatus, it is needed to light a back surface of the component that is held by the holding apparatus. To take a front-surface image of the component held by the holding apparatus, it is needed to light a front surface of the component that is opposed to the image taking device.

There is a holding apparatus which includes a suction nozzle for sucking and holding an electric component; a front-surface lighting device which lights a front surface of the component held by the nozzle; and a back-surface lighting device which lights a back surface of the component. With this holding apparatus, an image taking device can selectively take a silhouette image or a front-surface image of the component. Thus, the holding apparatus can be widely used. However, the light emitting surface of the back-surface lighting device is considerably light and, if the image taking device takes a front-surface image of the component in the background defined by the light emitting surface while the front-surface lighting device lights the front surface of the component, the image taking device takes, in addition to the front-surface image of the component, a light image of the background. In this case, it is difficult to extract accurately the image of the object from the background, and incorrect results may be obtained by the processing of the extracted image of the object. This problem might be solved by moving the back-surface lighting device away from the object when the front-surface image of the object is taken. In the latter case, however, the holding apparatus needs a more complicated structure, which leads to another problem that the production cost of the holding apparatus increases. In a particular case where the taking of front-surface image and the taking of silhouette image are frequently switched with each other, it needs a long time to switch them, which leads to lowering the operating efficiency of the holding apparatus.

In addition, it has widely been practiced that the suction nozzle and a main portion of the back-surface lighting device are constructed as an integral unit. For example, a light emitting plate including a plurality of point light sources, such as light emitting diodes, and a diffusing layer for diffusing the lights emitted by the point light sources and thereby emitting a substantially uniform light, is fixed to the suction nozzle, or alternatively a light emitting plate which absorbs infrared rays externally incident thereto and emits a visible light, a reflecting plate which reflects a light externally incident thereto, or a diffusing block which diffuses a light externally incident thereto and emits a light toward the suction nozzle, is fixed to the suction nozzle.

However, if the main portion of the back-surface lighting device is provided as the integral portion of the suction nozzle, the suction nozzle costs high. Generally, the suction nozzle includes a suction pipe, which may be bent to be not usable or whose suction surface (i.e., free end surface) may be worn to be not usable. If the main portion of the back-surface lighting device is provided as the integral portion of the suction nozzle, the suction nozzle as a whole including the main portion of the back-surface lighting device must be replaced with another suction nozzle including a main portion of another back-surface lighting device. This manner leads to increasing the running cost of the electric-component mounting system. Meanwhile, in the case where a plurality of sorts of suction nozzles are exchanged with one another corresponding to a plurality of sorts of electric components to be held, the number of suction nozzles employed increases. If each of those suction nozzles includes a main portion of a back-surface lighting device, the running cost costs very high. Moreover, in the case where the main portion of each back-surface lighting device includes a light emitting source, the light emitting source must be supplied with electric power. In the last case, when the suction nozzles are repetitively exchanged with one another, the contact of an electric-power supply circuit which supplies the electric power to the light emitting source may be worn or damaged, or an electric noise may be produced from the contact.

While the foregoing explanation relates to the holding apparatus, the transferring apparatus, the image taking device, etc. which are for use with electric components, objects to be held by the holding apparatus are not limited to the electric components. The above-explained problems may commonly occur to all holding apparatuses, all transferring apparatuses, all image taking devices, etc. that are for use with objects whose images need to be taken to recognize each object by image processing or to determine X-direction, Y-direction, and rotation positions of each object, measure one or more dimensions of each object, etc.

SUMMARY OF THE INVENTION

The present invention provides a holding apparatus, a transferring apparatus, an image taking system, and an image taking method that have one or more of the technical features that are described below in respective paragraphs given parenthesized sequential numbers (1) to (15). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed. However, the following technical features and the combinations thereof are just examples to which the present invention is by no means limited.

(1) According to a first feature of the present invention, there is provided a holding apparatus comprising a suction nozzle which applies a negative pressure to a back surface of an object and thereby holds the object; a front-surface lighting device which emits a first visible light toward a front surface of the object held by the suction nozzle and thereby lights the front surface; and a back-surface lighting device which lights the back surface of the object held by the suction nozzle and which includes (a) a light emitting plate which is provided around a base portion of the suction nozzle and emits a second light from a light emitting surface thereof facing a side of a free end of the suction nozzle that holds the object; and (b) a dark infrared-ray transmitting filter which is dark, covers the light emitting surface of the light emitting plate, and transmits infrared rays of the second light. The dark infrared-ray transmitting filter may be black. In the present holding apparatus, the light emitting surface of the light emitting plate of the back-surface lighting device is covered by the dark infrared-ray transmitting filter. Accordingly, when the front-surface lighting device lights the front surface of the object in taking a front-surface image of the object, the background of the object is defined by the dark filter. If the background is light, an image taking device takes, in addition to the front-surface image of the object, a light image of the background, so that when the taken images are processed, it is difficult to extract accurately the image of the object from that of the background. Since the present holding apparatus provides the dark background, the image of the object can be accurately extracted from that of the background. Meanwhile, when a silhouette image of the object is taken, the light emitting plate of the back-surface lighting device emits a light and the infrared-ray transmitting filter absorbs a visible-ray component of the emitted light and transmits infrared rays only. Therefore, with an image taking device which is sensitive to the infrared rays, a silhouette image of the object can be taken. Accordingly, the present holding apparatus allows a user or an operator to obtain selectively a silhouette image or a front-surface image of the object by just operating selectively the back-surface lighting device or the front-surface lighting device. Thus, the present holding apparatus enjoys much ease of use. In the case where an image taking device which is sensitive to both the visible light and the infrared rays is employed, the single image taking device can be commonly used to take both the silhouette and front-surface images of the object. This feature contributes to reducing the production cost of the holding apparatus.

(2) According to a second feature of the present invention that includes the first feature (1), the light emitting plate comprises a plurality of light emitting elements arranged along the light emitting surface thereof, and a diffusing plate which covers the light emitting surface and which diffuses respective lights emitted by the light emitting elements and thereby emits a substantially uniform light. If a plurality of light emitting elements are arranged along a plane, a light emitting plate can be obtained which has a light emitting surface defined by the plane. In this case, however, the distribution of light along the light emitting plane cannot be uniform. In the present holding apparatus, the light emitting plate is covered by the diffusing plate which diffuses the light emitted by the light emitting surface, thereby reducing the uneven distribution of light and emitting a substantially uniform light. The diffusing plate and the infrared-ray transmitting filter may be provided by respective layers which are superposed on each other, or may be provided by a single layer which functions as both of them.

(3) According to a third feature of the present invention that includes the first or second feature (1) or (2), the holding apparatus further comprises a support portion to which the suction nozzle is detachably attached, the back-surface lighting device including a main portion which is separate from the suction nozzle and is supported by the support portion such that when the suction nozzle is detached from the support portion, the main portion remains supported by the support portion. In the present holding apparatus, the suction nozzle can be detached, as needed, from the support portion, while the main portion of the back-surface lighting device remains supported by the support portion. For example, in the case where a plurality of sorts of suction nozzles are exchanged with one another corresponding to a plurality of sorts of objects to be held, the main portion of the single back-surface lighting device may be commonly used with each selected one of the different sorts of suction nozzles. This feature also contributes to decreasing the running cost of the holding apparatus. Moreover, even in the case where the main portion of the back-surface lighting device includes a light emitting source, the main portion need not be detached from the support portion when the different sorts of suction nozzles are exchanged with one another. This feature solves the problems that the contact of an electric-power supply circuit is worn or damaged and an electric noise is produced from the contact. According to the present invention, a portion of the back-surface lighting device may be provided as an integral portion of the suction nozzle or each of the different sorts of suction nozzles. In this case, the suction nozzle, or each suction nozzle, including the portion of back-surface lighting device is attached to, and detached from, the support portion of the holding head. Alternatively, the entirety of the back-surface lighting device may be directly supported by the support portion of the holding apparatus. In the last case, when the suction nozzle is detached from the support portion, no portion of the back-surface lighting device is detached from the support portion.

(4) According to a fourth feature of the present invention that includes the third feature (3), the main portion of the back-surface lighting device comprises a tubular lighting portion which emits, from an inner surface thereof, a first light; and an outer lighting portion which extends outward from the tubular lighting portion and which emits, from one surface thereof, a second light in a direction parallel to a centerline of the tubular lighting portion, and wherein the suction nozzle comprises a light converting portion which is fitable in an inner space of the tubular lighting portion and which converts the first light emitted by the tubular lighting portion into a third light having the direction parallel to the centerline of the tubular lighting portion; and a suction pipe which holds the object and which extends from one end of the light converting portion in the direction parallel to the centerline of the tubular lighting portion, one end portion of the suction nozzle that is opposite to the suction pipe being detachably attached to the support portion. In the present holding apparatus, the suction nozzle includes, in addition to the suction pipe, the light converting portion as a portion of the back-surface lighting device. In the state in which the suction nozzle is attached to the support portion of the holding apparatus, the light converting portion is positioned in the inner space of the tubular lighting portion, and converts the light emitted from the inner surface of the tubular lighting portion into a light having a direction parallel to the centerline of the tubular lighting portion. Thus, the back surface of the object held by the suction pipe is lighted with a sufficient amount of light even in the vicinity of the pipe, and a clear silhouette image of the object can be taken by an image taking device. It is preferred that the inner surface of the tubular lighting portion has a circular cross section. However, the inner surface may have a square cross section or any other appropriate shape. The fourth feature (4) may not be combined with the third feature (3) wherein the suction nozzle can be detached from the support portion while the main portion of the back-surface lighting device still remains supported by the support portion. That is, a holding apparatus may employ the fourth feature (4), independent of the third feature (3).

(5) According to a fifth feature of the present invention that includes the fourth feature (4), at least one of the tubular lighting portion and the outer lighting portion comprises a plurality of light emitting elements which emits respective lights and which are arranged on a plurality of lattice points, respectively; and a diffusing layer which diffuses the lights emitted by the light emitting elements and thereby emits a substantially uniform light. In the present holding apparatus, the light emitting elements need the supply of electric power. However, the light emitting elements can remain on the support portion when the suction nozzle is detached from the support portion. Therefore, an electric-power supply circuit which supplies the electric power to the light emitting elements need not be provided with a contact that is frequently connected and disconnected. Thus, the present holding apparatus is free of the problems that the contact is damaged and an electric noise is produced from the contact.

(6) According to a sixth feature of the present invention that includes the fourth or fifth feature (4) or (5), the light converting portion comprises a tapered reflecting surface which is coaxial with the suction pipe and whose radius increases in a direction away from a free end of the suction pipe that holds the object. The tapered reflecting surface can easily deflect the light emitted radially inward from a cylindrical inner circumferential surface of the tubular lighting portion, to a direction substantially parallel to an axis line of the suction pipe.

(7) According to a seventh feature of the present invention that includes the fourth or fifth feature (4) or (5), the light converting portion comprises a diffusing block which diffuses the first light emitted by the tubular lighting portion and emits the third light from an outer surface thereof located on a side of the suction pipe. The diffusing block receives, at the outer surface thereof, the light emitted from the inner surface of the tubular lighting portion, and diffuses therein the received light so that the block becomes lighter as a whole. Accordingly, a light is emitted toward the object held by the suction pipe from a pipe-side surface of the diffusing block.

(8) According to an eighth feature of the present invention that includes any one of the fourth to seventh features (4) to (7), the holding apparatus further comprises a support rod which is supported by the support portion such that the support rod is movable in a direction parallel to an axis line of the suction pipe; an attaching device which attaches the suction nozzle to one end portion of the support rod such that the suction nozzle is detachable from the support rod; and a support-rod moving device which moves the support rod in a direction parallel to an axis line thereof, thereby moving the light converting portion of the suction nozzle relative to the tubular lighting portion in the direction parallel to the centerline thereof, so that the suction pipe of the suction nozzle is advanceable and retractable in the direction parallel to the axis line thereof. In the present holding apparatus, the suction nozzle including the light converting portion and the suction pipe is attached to the support portion via the support rod, and the support rod is moved, by the support rod moving device, relative to the support portion in an axial direction of the rod, so that the suction pipe is advanced and retracted in an axial direction thereof. The advancing and retracting movements of the suction pipe can be utilized for, e.g., causing the pipe to hold the object or mount the object on a mount surface. For example, in the case where the object is an electric component, the suction pipe can be caused to take the component from an electric-component supplying device and mount the same on a PCB. In this case, since the main portion of the back-surface lighting device need not be advanced or retracted with the suction nozzle, the nozzle can be quickly advanced and retracted while being prevented from producing vibration or noise. Thus, the present holding apparatus can mount electric components with high efficiency. In addition, the main portion of the back-surface lighting device can be effectively prevented from interfering with electric components which have already been mounted on the PCB, and the force with which the suction nozzle contacts each electric component and/or the force with which the nozzle presses each component on the PCB can be accurately controlled.

(9) According to a ninth feature of the present invention that includes any one of the fourth to eighth features (4) to (8), the main portion of the back-surface lighting device further comprises an auxiliary lighting portion which is opposed to a gap provided between the tubular lighting portion and the light converting portion and which emits a fourth light toward a side of the suction pipe via the gap. In the present holding apparatus, the auxiliary lighting portion lights the gap provided between the tubular lighting portion and the outer lighting portion. Accordingly, the back surface of the object is lighted with a uniform light and a clear silhouette image of the object can be obtained.

(10) According to a tenth feature of the present invention, there is provided a transferring apparatus comprising a holding apparatus according to any one of the first to ninth features (1) to (9); a moving device which moves the suction nozzle and the back-surface lighting device of the holding apparatus in a direction perpendicular to an axis line of the suction nozzle; and an image taking device which is provided at a predetermined position in a range in which the moving device moves the suction nozzle and the back-surface lighting device of the holding apparatus, so that when the suction nozzle and the back-surface lighting device are positioned at the predetermined position, the image taking device is opposed to the suction nozzle and the back-surface lighting device and takes an image of the object held by the suction nozzle. The range in which the holding apparatus is moved may be a one-dimensional, two-dimensional, or three-dimensional range. In the present transferring apparatus, the object is held by the holding apparatus, which in turn is moved by the moving device, so that the holding apparatus is opposed to the image taking device. Thus, a silhouette image of the object held by the suction nozzle can be taken by the image taking device. Image data representing the thus taken silhouette image may be processed to identify the object, determine one or more positions of the object held by the suction nozzle, and/or measure one or more dimensions of the object. For example, in the case where the object is an electric component, the holding apparatus receives the electric component from an electric-component supplying device, transfers it, and mounts it on a PCB. Before the holding apparatus mounts the component on the PCB, the image taking device takes an image of the component held by the suction nozzle, and the taken image is processed to determine one or more sorts of positional errors of the component held by the nozzle. After the positional errors of the component are corrected, the holding apparatus mounts the component on the PCB.

(11) According to an eleventh feature of the present invention that includes the tenth feature (10), the transferring apparatus further comprises a nozzle stocker which stocks at least one suction nozzle; and a nozzle-exchange control device which controls the moving device to move the suction nozzle of the holding apparatus to a position where the suction nozzle of the holding apparatus is opposed to the nozzle stocker, and causes the suction nozzle of the holding apparatus to be exchanged with the one suction nozzle stocked by the nozzle stocker. In the present transferring apparatus, the moving device for transferring the object held by the suction nozzle is additionally used for automatically exchanging the suction nozzles with each other. Thus, the transferring apparatus capable of automatically exchanging the suction nozzles can be produced at low cost.

(12) According to a twelfth feature of the present invention, there is provided an image taking system comprising a front-surface lighting device which emits a first visible light toward a front surface of an object whose back surface is held by a holding portion of a holding device and thereby lights the front surface; a first image taking device which is sensitive to the first visible light and takes an image of the object being lighted by the front-surface lighting device; a back-surface lighting device which is provided in back of the object held by the holding portion of the holding device, which lights the back surface of the object held by the holding portion, and which includes (a) a light emitting plate which emits a second light from a light emitting surface thereof facing a side of the holding portion holding the back surface of the object; and (b) a dark infrared-ray transmitting filter which is dark, covers the light emitting surface of the light emitting plate, and transmits infrared rays of the second light; and a second image taking device which is sensitive to the infrared rays and takes an image of the object being lighted by the back-surface lighting device. The present image taking system can take an excellent silhouette image of the object while the back-surface lighting device lights with the infrared rays the back surface of the object, and can take an easily processable front-surface image of the object in a dark background defined by the infrared-ray transmitting filter of the back-surface lighting device. Thus, the present image taking system can selectively take, with ease, an excellent silhouette image and an excellent front-surface image of the object.

(13) According to a thirteenth feature of the present invention that includes the twelfth feature (12), the first and second image taking devices is provided by a single image taking device which is sensitive to both the first visible light and the infrared rays of the second light. In the present image taking system, the single image taking device can be commonly used to take a silhouette image formed by the infrared rays and take a front-surface image formed by the visible light. This feature contributes to reducing the production cost of the image taking system.

(14) According to a fourteenth feature of the present invention, there is provided a method of taking an image of an object which is held by a holding device, comprising the steps of providing, in front of the object whose back surface is held by a holding portion of the holding device, a front-surface lighting device which emits a first visible light toward a front surface of the object and thereby lights the front surface, providing, in back of the object held by the holding portion of the holding device, a back-surface lighting device which lights the back surface of the object held by the holding portion and which includes (a) a light emitting plate which emits a second light from a light emitting surface thereof facing a side of the holding portion holding the back surface of the object; and (b) a dark infrared-ray transmitting filter which is dark, covers the light emitting surface of the light emitting plate, and transmits infrared rays of the second light, operating the front-surface lighting device and a first image taking device which is sensitive to the first visible light, to take, in a background defined by the dark infrared-ray transmitting filter, an image of the front surface of the object that is lighted by the front-surface lighting device, and operating the back-surface lighting device and a second image taking device which is sensitive to the infrared rays of the second light, to take a silhouette image of the object whose back surface is lighted by the back-surface lighting device. The present image taking method can enjoy the same advantages as those of the image taking system according to the twelfth feature (12).

(15) According to a fifteenth feature of the present invention that includes the fourteenth feature (14), the first and second image taking devices is provided by a single image taking device which is sensitive to both the first visible light and the infrared rays of the second light. The present image taking method can enjoy the same advantages as those of the image taking system according to the thirteenth feature (13).

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Hereinafter there will be described an electronic-component ("EC") mounting system as a preferred embodiment of the present invention, by reference to FIGS. 1 to 5.

The EC mounting system mounts an EC 32 (FIG. 2) as a sort of electric component as an object, on a printed circuit board ("PCB") as a sort of circuit substrate.

Figure 1:
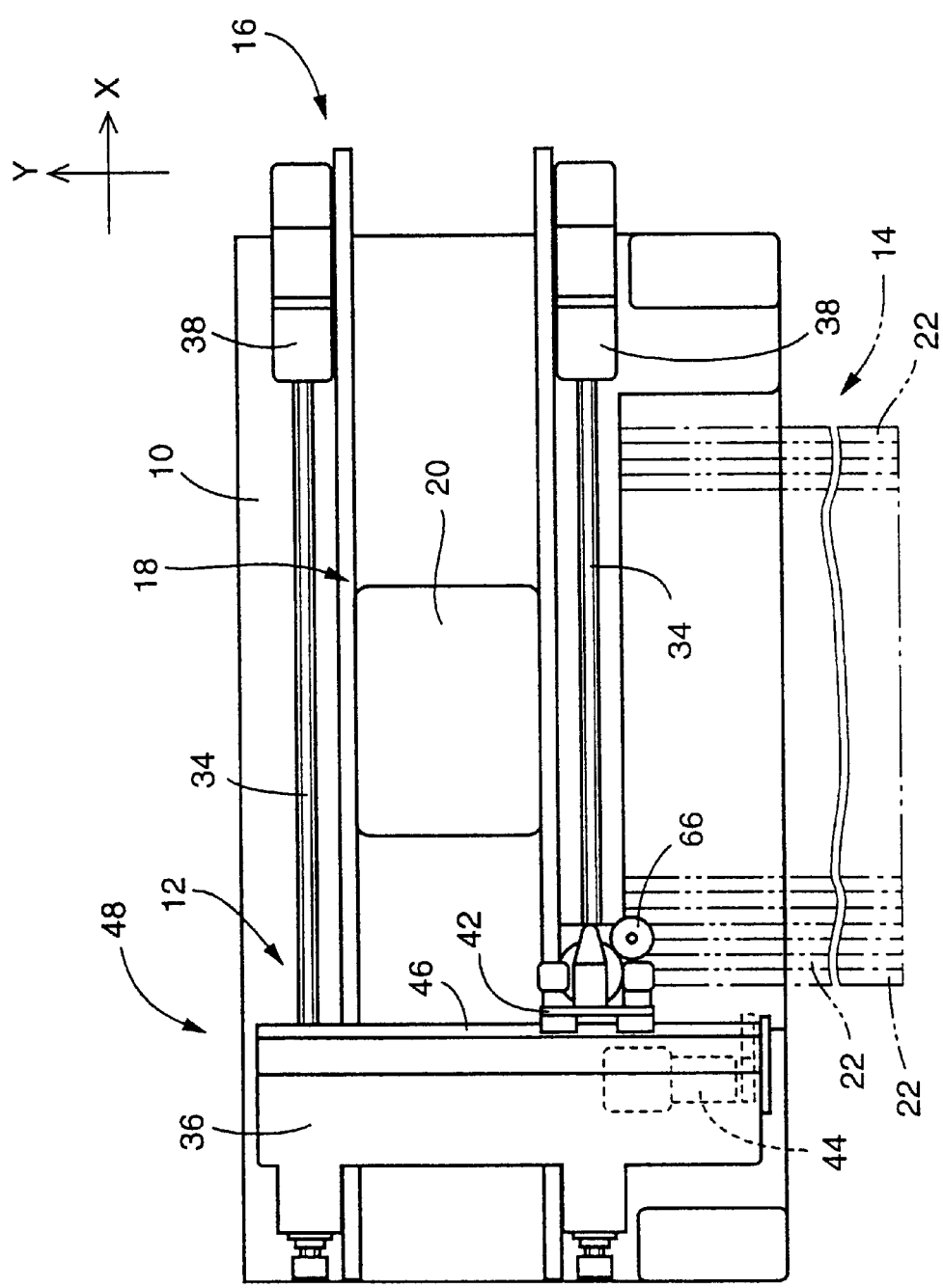
FIG. 1 is a schematic plan view of an electronic-component ("EC") mounting system including a holding apparatus to which the present invention is applied.

In FIG. 1, reference numeral 10 designates a base on which an EC transferring and mounting device 12, an EC supplying device 14, and a PCB conveying device 16 are provided. The PCB conveying device 16 includes a PCB conveyor 18 which extends in an X direction, indicated at arrow in FIG. 1, and which conveys a PCB 20 to a predetermined EC-mount position where the PCB 20 is positioned and supported by a PCB positioning and supporting device (not shown).

The EC supplying device 14, indicated at two-dot chain line in FIG. 1, is provided on one side of the PCB conveyor 18 in a Y direction which is perpendicular to the X direction on a horizontal plane. The EC supplying device 14 includes a number of EC-supply cartridges 22 which are arranged in the X direction, and is fixed at a predetermined position.

The EC transferring and mounting ("T/M") device 12 includes an EC holder 30 (FIG. 2) which is linearly movable in each of the X and Y directions to receive the EC 32 from the EC supplying device 14, transfer the EC 32, and mount the same 32 on the PCB 20. To this end, the EC T/M device 12 additionally includes two ball screws 34 which are provided, on the base 10, on both sides of the PCB conveyor 18 in the Y direction such that the two ball screws 34 extend parallel to each other. The two ball screws 34 are threadedly engaged with two nuts (not shown), respectively, which are fixed to an X-direction slide 36. When the two balls screws 34 are rotated by two X-direction servomotors 38, respectively, the X-direction slide 36 is moved in the X direction. On the base 10, there are provided two guide rails (not shown) as two guide members below the two ball screws 34, respectively. The X-direction slide 36 has two guide blocks (not shown) as two guided members which slideably fit on the two guide rails, respectively, and cooperate with the same to guide the movement of the slide 36 in the X direction.

The X-direction slide 36 supports a ball screw 40 (FIG. 2) which extends in the Y direction, and a Y-direction slide 42 is threadedly engaged with the hall screw 40 via a nut (not shown). When the the ball screw 40 is rotated by a Y-direction servomotor 44, the Y-direction slide 42 is moved in the Y direction while being guided by a pair of guide rails 46 which extend in the Y direction.

The base 10, the nuts, the ball screws 34, the X-direction servomotors 38, the X-direction slide 36, the nut, the ball screw 40, the Y-direction servomotor 44, and the Y-direction slide 42 cooperate with one another to provide an X-Y robot 48.

Figure 2:
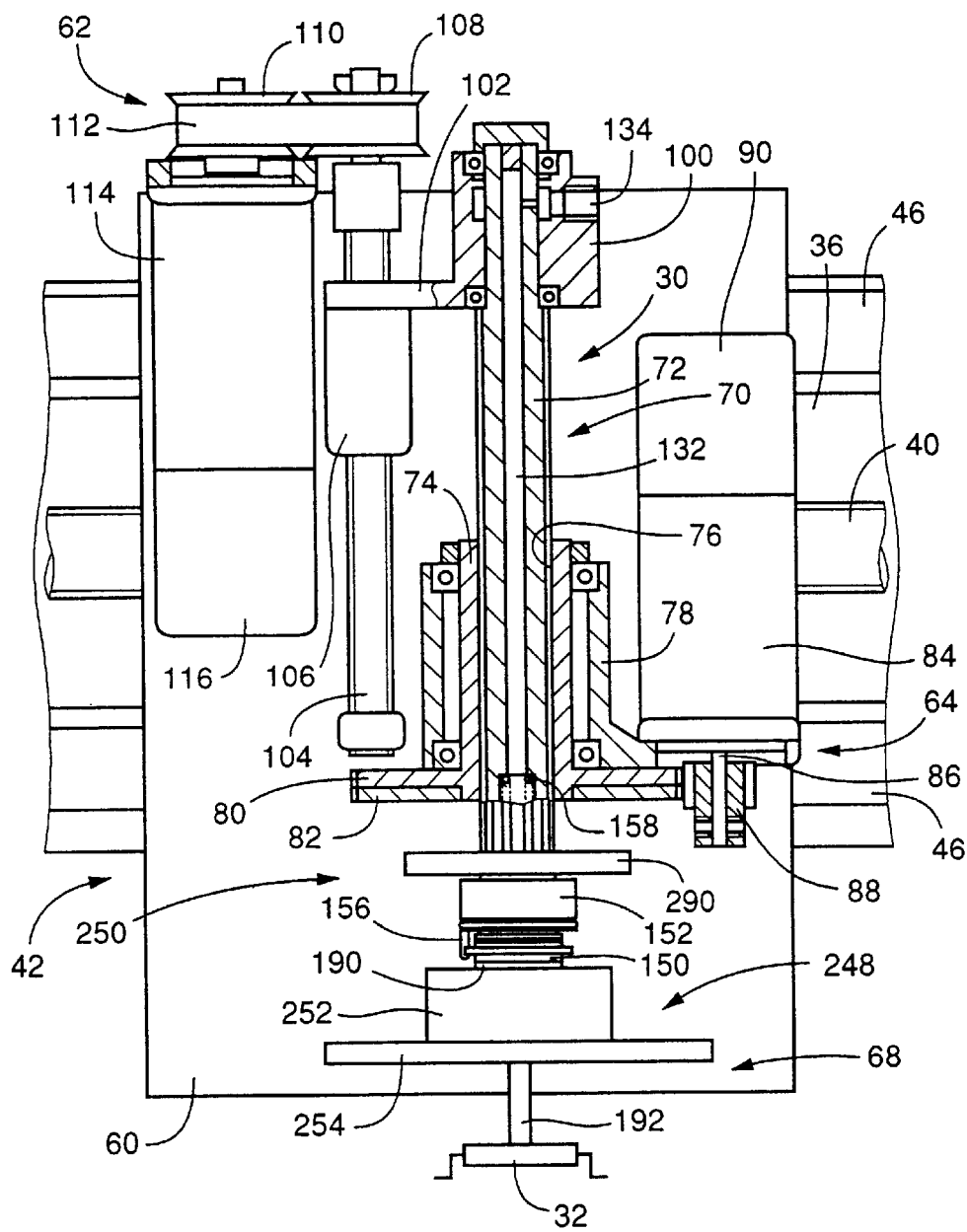
FIG. 2 is a partly cross-sectioned, front elevation view of the holding apparatus and an image taking device of the EC mounting system of FIG. 1.
Figure 2:
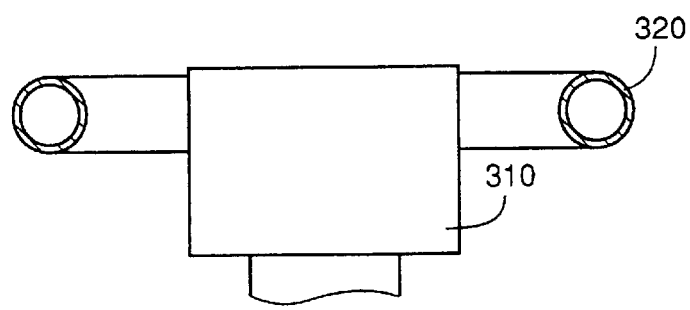

As shown in FIG. 2, the EC holder 30 is attached to a vertical surface 60 such that the EC holder 30 is movable up and down and is rotatable about a vertical axis line. The vertical surface 60 additionally supports an elevating and lowering device 62 which elevates and lowers the EC holder 30, that is, moves the same 30 up and down; a rotating device 64 which rotates the EC holder 30 about the vertical axis line and thereby rotates the EC 32 held by the holder 30 about the same axis line; and a CCD (charge-coupled device) camera 66 (FIG. 1) which takes respective images of reference marks affixed to the PCB 20.

The EC holder 30 includes a suction nozzle 68 which sucks and holds the EC 32; and a holder body 70 which supports the suction nozzle 68. The holder body 70 includes a spline axis member 72 which fits in a spline hole of a sleeve 74. The sleeve 74 fits in an arm 78 projecting from the vertical surface 60 of the Y-direction slide 42, such that the sleeve 74 is rotatable about the vertical axis line and is immovable in an axial direction thereof. A lower end portion of the sleeve 78 that projects downward from the arm 78 supports a pair of wheels 80, 82 that prevent backlash. The two wheels 80, 82 are meshed with a wheel 88 which is fixed to an output shaft 86 of a rotation servomotor 84 of the rotating device 64 and is rotated by the rotation servomotor 84. Thus, the spline axis member 72 is accurately rotated about its axis line by the servomotor 84 via the wheels 88, 80, 82 and the sleeve 74, and accordingly the EC holder 30 is accurately rotated about the vertical axis line which coincides with the axis line of the spline member 72. The rotation servomotor 84 can rotate in opposite directions, and the current rotation angle of the servomotor 84 is detected by an encoder 90 as a sort of rotation-angle detector. Thus, the current rotation angle of the EC holder 30 is detected or obtained.

A connect member 100 is attached to an upper end portion of the spline axis member 72, such that the connect member 100 is rotatable relative to the spline member 72 and is immovable relative to the same 72 in its axial direction. The connect member 100 includes a horizontal portion 102 which is fixed to a nut 106 which in turn is threadedly engaged with a ball screw 104. The ball screw 104 is attached to the vertical surface 60 of the Y-direction slide 42 such that the ball screw 104 is rotatable about its vertical axis line and is immovable in its axial direction. When the ball screw 104 is rotated by an elevating and lowering servomotor 114 via timing pulleys 108, 110 and a timing belt 112, the nut 106 is elevated and lowered, so that the connect member 100, the holder body 70, and the EC holder 30 are elevated and lowered, i.e. moved up and down.

The elevating and lowering servomotor 114 can rotate in opposite directions, and the current rotation angle of the servomotor 114 is detected by an encoder 116 as a sort of rotation-angle detector. Thus, the current height position of the EC holder 30 is detected or obtained. In the present embodiment, the EC holder 30 is elevated and lowered in sucking (i.e., holding) and mounting the EC 32, in an EC-suck-and-mount range under its downward-movement-start position (i.e., uppermost end position) shown in FIG. 2. Each of the elevating and lowering servomotor 114, the X-direction servomotors 38, and the Y-direction servomotor 44 is an electric rotary motor as a sort of electric motor and is accurately controllable with respect to rotation angle or phase and rotation speed. Those servomotors 114, 38, 44 may be replaced with stepper motors.

The suction nozzle 68 is supported by a lower end portion of the spline axis member 72. The suction nozzle 68 applies a negative pressure to a back surface of the EC 32 and thereby holds the same 32. The spline member 72 has an inner passage 132 which is connected to a vacuum source (not shown) via a port 134. A solenoid-operated direction-control valve 136 (FIG. 5) is provided between the passage 132 and the vacuum source. Upon switching of the direction-control valve 136, the suction nozzle 68 is selectively communicated with the vacuum source or the atmosphere, and sucks or releases the EC 32.

Figure 3:
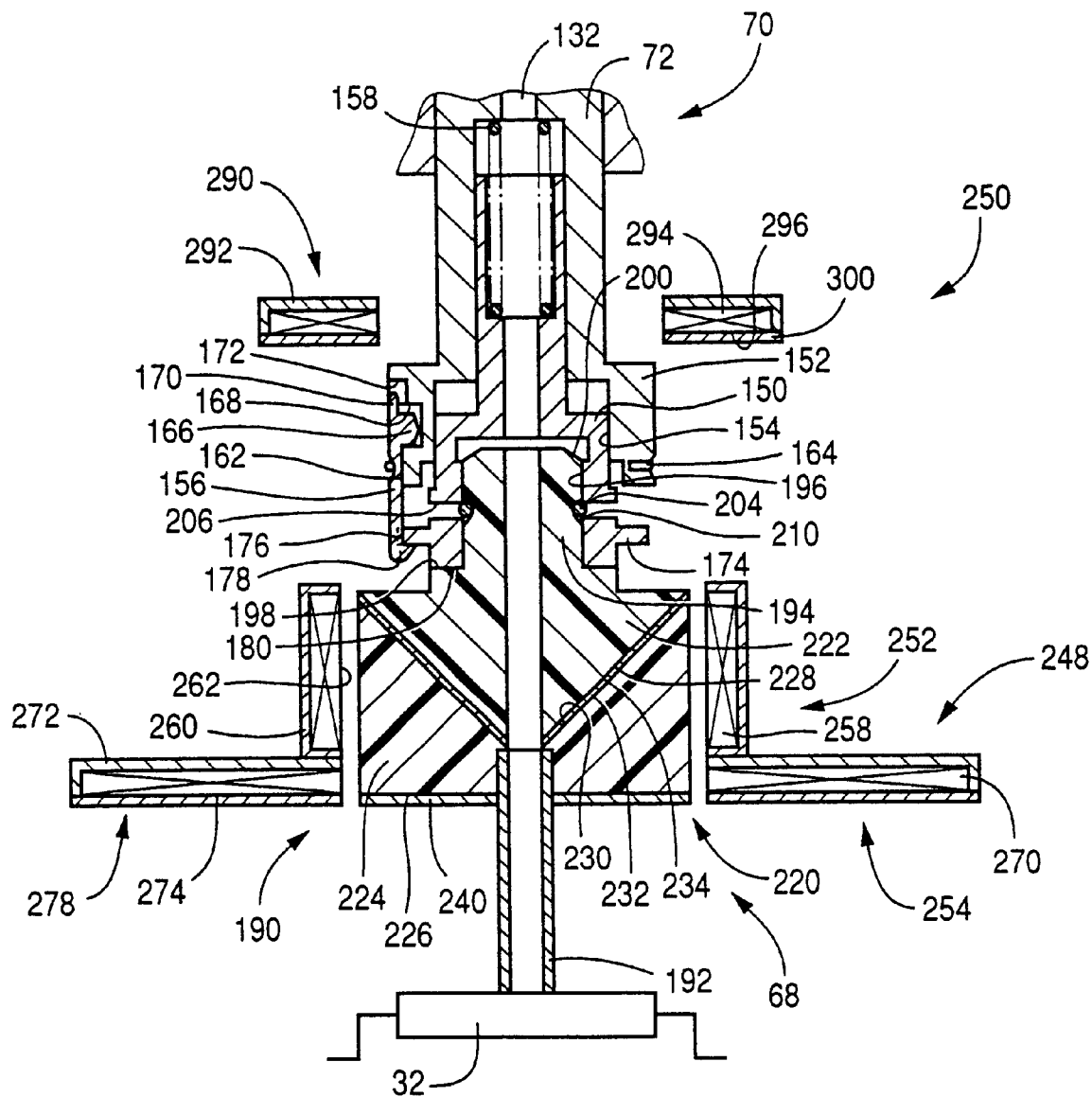
FIG. 3 is a cross-sectioned, front elevation view of a suction nozzle, a holder body, and a back-surface lighting device of the holding apparatus of FIG. 2.

As shown in FIGS. 2 and 3, the suction nozzle 68 is-attached to the spline axis member 72 via an adaptor 150 such that the suction nozzle 68 is coaxial with the spline member 72. The adaptor 150 fits in a receiving hole 154 formed in a nozzle receiving portion 152 provided by the lower end portion of the spline member 72, such that the adaptor 150 is movable relative to the receiving portion 152 in the axial direction of the spline member 72. The adaptor 150 is held by a plurality of holding members 156 (only one holding member 156 is shown in FIGS. 2 and 3) which are supported by the nozzle receiving portion 152 such that the holding members 156 are equiangularly spaced from each other about the axis line of the spline member 72. The adaptor 150 is biased by a compression coil spring 158 as a sort of spring member as an elastic member as a biasing member or device, in a direction in which the adaptor 150 is moved or pushed downward out of the nozzle receiving portion 152.

The nozzle receiving portion 152 has a plurality of recesses 162 which extend parallel to the axis line of the spline axis member 72 and which are equiangularly spaced from each other about the axis line. The holding members 156 fit in the recesses 162, respectively, such that each of the holding members 156 is pivotable about a horizontal axis line, and are prevented from coming off the nozzle receiving portion 152 by. a ring-like spring member 164 wound around the receiving portion 152. Each holding member 156 has a projection 166 which projects toward a centerline of the nozzle receiving portion 152 and which fits in a bottom recess 168 formed in the bottom of the receiving portion 152. Each holding member 156 is pivotable about its horizontal axis line at which the projection 166 contacts a bottom surface of the bottom recess 168. The horizontal axis line is perpendicular to a lengthwise direction of the each holding member 156 and is parallel to a tangential line which contacts a portion of the receiving portion 152 to which the each holding member 156 is attached.

Each of the holding members 156 has, above the projection 166, an operable portion 170 which fits in an upper recess 172 formed in the nozzle receiving portion 152. Since each holding member 156 fits in the recess 162 and its operable portion 170 fits in the upper recess 172, the each holding member 156 is prevented from being rotated or pivoted about a horizontal axis line perpendicular to the axis line of the spline axis member 72.

A lower end portion of each of the holding members 156 fits in a lower recess 176 formed in a large-diameter portion 174 of the adaptor 150. Thus, the adaptor 150 is prevented from being rotated relative to the nozzle receiving portion 152. The lower end portion of the each holding member 156 has an engaging projection 178 which projects toward the adaptor 150. Since the respective engaging projections 178 of the holding members 156 engage a lower surface of the large-diameter portion 174 of the adaptor 150, the adaptor 150 is prevented from coming off the receiving hole 154 of the nozzle receiving portion 152. When the adaptor 150 is removed from the nozzle receiving portion 152, first, the spline axis member 72 is moved downward from its downward-movement-start position, and then the respective operable portions 170 of the holding members 156 are pushed to pivot the holding members 156 against the biasing force of the spring member 164. Thus, the engaging projections 178 of the holding members 156 are released from the engagement with the large-diameter portion 174 of the adaptor 150, so that the adaptor 150 can be removed from the receiving portion 152. The adaptor 150 has a lower end surface providing a plane contact surface 180 perpendicular to the axis line of the spline axis member 72.

The suction nozzle 68 includes a suction pipe 192 and a suction-pipe holder 190 which is formed of a synthetic resin and which holds the suction pipe 192 such that the pipe 192 is coaxial therewith. An end portion of the pipe holder 190 that is distant from the suction pipe 192 provides a fitting portion 194 which fits in a receiving hole 196 formed in the adaptor 150 and which is prevented from coming off the adaptor 150 by a spring member 204. The pipe holder 190 has a stepped, cylindrical shape whose diameter stepwise decreases in an upward direction, and has a stepped, plane contact surface 198 perpendicular to the center line of the holder 190. An upper end portion of the fitting portion 194 has a tapered surface 200 whose diameter decreases in an upward direction. The spring member 204 has a generally U shaped configuration whose two arms fit in two recesses 206, respectively, formed in the adaptor 150, such that respective intermediate portions of the two arms project, owing to the elastic restoring force of the spring member 204, radially inwardly of the inner circumferential surface of the receiving hole 196 of the adaptor 150. Since the two arms of the spring member 204 are bent so that respective free end portions of the two arms approach each other, the spring member 204 is prevented from coming off the adaptor 150.

When the fitting portion 194 of the suction-pipe holder 190 is inserted into the receiving hole 196 of the adaptor 150 while the tapered surface 200 of the fitting portion 194 widens the two arms of the spring member 204, the two arms of the spring member 204 fit in an annular groove 210 formed in the fitting portion 194 and thereby engage the fitting portion 194. Thus, the spring member 204 holds the pipe holder 190 and somewhat draws or pulls the same 190 into the receiving hole 196 of the adaptor 150. The fitting portion 194 fits in the receiving hole 196 such that the contact surface 198 of the pipe holder 190 is held in contact with the contact surface 180 of the adaptor 150, and in this state the center of the circular cross section of the spring member 204 is somewhat lower than that of the semicircular cross section of the annular groove 210. Therefore, the spring member 204 engages the upper portion of the inner surface of the annular groove 210, thereby drawing or pulling, owing to its elastic restoring force, the pipe holder 190 into the receiving hole 196. Since the two contact surfaces 198, 180 are held in contact with each other, the suction nozzle 68 is positioned in a vertical direction and is prevented from being tilted relative to the spline axis member 72. The suction nozzle 68 can be removed from the adaptor 150 by pulling the nozzle 68 with a force greater than the pulling force of the spring member 204, in a direction opposite to the direction in which the spring member 204 pulls in the nozzle 68. In the present embodiment, the spline axis member 72 cooperates with the adaptor 150 to provide a support rod which supports the suction nozzle 68 such that the nozzle 68 is detachable from the support rod. The spring member 204 as the means for attaching the suction nozzle 68 to the support rod such that the nozzle 68 is detachable from the rod, may be replaced with a device which attaches, owing to a negative pressure or a magnetic force, the nozzle 68 to the rod such that the nozzle 68 is detachable from the rod.

The suction-pipe holder 190 includes a block portion 220 which is opposite to the fitting portion 194 and which has a cylindrical shape whose diameter is greater than that of the fitting portion 194. The block portion 220 includes an upper portion 222 and a lower portion 224 which are provided as separate members for easier production and are assembled with each other. The upper portion 222 is formed integrally with the fitting portion 194, and the suction pipe 192 is attached to the lower portion 224 such that the pipe 192 extends downward from a lower surface 226 thereof along a straight line extending downward from the centerline of the pipe holder 190. The upper portion 222 has a lower tapered surface 228 which is coxial with the suction pipe 192 and is inclined by 45 degrees relative to the centerline of the pipe holder 190 and whose diameter increases in a direction away from the suction pipe 192. The lower portion 224 has an upper tapered surface 230 corresponding to the lower tapered surface 228 of the upper portion 222. The upper and lower portions 222, 224 are connected to each other at the respective tapered surfaces 228, 230 via a tapered reflecting surface 232 corresponding to the tapered surfaces 228, 290. In the present embodiment, a metallic layer 234 such as aluminum or silver is formed by, e.g., vapor deposition on the lower tapered surface 228 of the upper portion 222, and the reflecting surface 232 is defined or provided by a lower surface of the metallic layer 234. However, it is possible to form the reflecting surface 232 by forming a metallic layer on the upper tapered surface 230 of the lower portion 224, or it is possible to employ silver mirror reaction in place of vapor deposition. Moreover, it is possible to employ an upper portion 222 formed of metal and polish a lower tapered surface 228 of the upper portion 222 into a tapered reflecting surface 232. The lower portion 224 of the block portion 2220 is formed of a transparent synthetic resin, and the lower surface 226 of the lower portion 224 is covered with a dark (e.g., black infrared-ray ("IR-ray") transmitting filter 240. The IR-ray transmitting filter 240 includes an IR-ray transmitting layer and a diffusing layer which are superimposed or laminated on each other. The IR-ray transmitting filter 240 absorbs visible rays and transmits and diffuses IR rays. Thus, the IR-ray transmitting filter 240 also functions as a diffusing plate.

A main lighting portion 248 is supported by the vertical surface 60 of the Y-direction slide 42, such that the main lighting portion 248 is coaxial with the suction nozzle 68 and surrounds the same 68 positioned at its downward-movement-start position. The main lighting portion 248 cooperates with the block portion 220 and an auxiliary lighting portion 290 to provide a back-surface lighting device 250. The main lighting portion 248 includes a cylindrical lighting portion 252 (hereinafter, referred to as the "tubular" lighting portion 252), and a flange-like lighting portion 254 which extends radially outwardly from a lower end of the tubular lighting portion 252 and has an annular-flange-like shape. The flange-like lighting portion 254 is fixed to the vertical surface 60 of the Y-direction slide 42 via a bracket (not shown). A small gap is provided between the suction-pipe holder 190 and the two lighting portions 252, 254. The suction nozzle 68 is movable relative to the main lighting portion 248 in an axial direction of the nozzle 68. In FIG. 3, the gap provided between the pipe holder 190 and the main lighting portion 248 is exaggerated for easier understanding purposes only.

The tubular lighting portion 252 includes a light emitting body 258 which includes a disc-like PCB and a number of light emitting diodes arranged on lattice points on the PCB. One surface of the PCB that does not support the diodes is supported by a cylindrical support member 260, so that a light emitting surface 262 of the lighting portion 252 faces radially inward. Since the PCB and the diodes are well known in the art, the description and illustration thereof are omitted. The cylindrical support member 260 is connected to a drive circuit 406 (FIG. 5, described later) via a lead wire (not shown). When the drive circuit 406 supplies an electric current to the light emitting body 258, the tubular lighting portion 252 emits a light from the light emitting surface 262, i.e., the inner circumferential surface thereof, toward the suction nozzle 68. The diodes of the light emitting body 258 are ones each of which emits a light including a plenty of IR rays.

When the light is emitted from the light emitting surface 262 of the tubular lighting portion 252, toward the suction-pipe holder 190 of the suction nozzle 68, in a direction perpendicular to the axis line of the nozzle 68, the light is reflected by the reflecting surface 232 of the pipe holder 190 and thereby is deflected to a downward direction. The light passes through the lower portion 224 of the block portion 220, and the components thereof other than the IR rays are removed, and the IR rays are diffused, by an IR-ray transmitting filter 240. Consequently the back surface of the EC 32 held by the suction pipe 192 is lighted with the substantially uniform IR rays only.

Like the tubular lighting portion 252, the flange-like lighting portion 254 includes a light emitting body 270 which includes a disc-like PCB and a number of light emitting diodes arranged in a lattice or a matrix on the PCB. One surface of the PCB that does not support the diodes is supported by an annular support member 272, so that a light emitting surface 274 of the lighting portion 270 faces downward, i.e., toward the suction pipe 192. The light emitting surface 274, i.e., the lower surface of the light emitting body 270 is covered with an annular, IR-ray transmitting filter 278. Since the light emitting body 270 and the transmitting filter 278 are similar to the light emitting body 258 and the transmitting filter 240, respectively, substantially uniform IR rays are emitted downward from the surface 274, so that the back surface of the EC 32 held by the suction pipe 192 is lighted with the substantially uniform IR rays. In the present embodiment, the flange-like lighting portion 254 is driven by the same drive circuit 406 as that for the tubular lighting portion 252. However, it is possible to employ two drive circuits for driving the two lighting portions 252, 254, respectively.

An auxiliary lighting portion 290 is provided above the tubular lighting portion 252 such that the auxiliary lighting portion 290 is opposed to the gap provided between the tubular lighting portion 252 and the suction-pipe holder 190. The auxiliary lighting portion 290 is fixed to the vertical surface 60 of the Y-direction slide 42 via a bracket (not shown). The auxiliary lighting portion 290 includes a light emitting body 294 which is supported by an annular support plate 292 and whose lower surface, i.e., light emitting surface 296 is covered with an annular IR-transmitting filter 300 like the flange-like lighting portion 254. Since the light emitting body 294 and the transmitting filter 300 are similar to the light emitting body 258 and the transmitting filter 240, respectively, the auxiliary lighting portion 290 emits only substantially uniform IR rays which are directed toward the suction pipe 192 via the gap provided between the pipe holder 190 and the tubular lighting portion 252.

A CCD camera 310 as an image taking device which takes an image of the EC 32 held by the suction nozzle 68 is provided on the base 10 at a position between the EC supplying device 14 and the PCB conveying device 16 in the Y direction. The CCD camera 310 includes a lens system and a matrix of CCDs, and is opposed, in the state in which the EC holder 30 is positioned at an EC-image-take position where the suction pipe 192 is positioned right above the CCD camera 310, to the back-surface lighting device 250 with the EC 32 held by the suction pipe 192 being positioned between the camera 310 and the lighting device 250. A ring lamp 320 is provided around the CCD camera 310, and is fixed to the base 10 via a bracket (not shown). The ring lamp 320 emits a visible light toward a front surface of the EC 32 held by the suction pipe 192, and thus functions as a front-surface lighting device. In the present embodiment, the CCD camera 310 is sensitive to each of the visible light and the IR rays.

Figure 6:
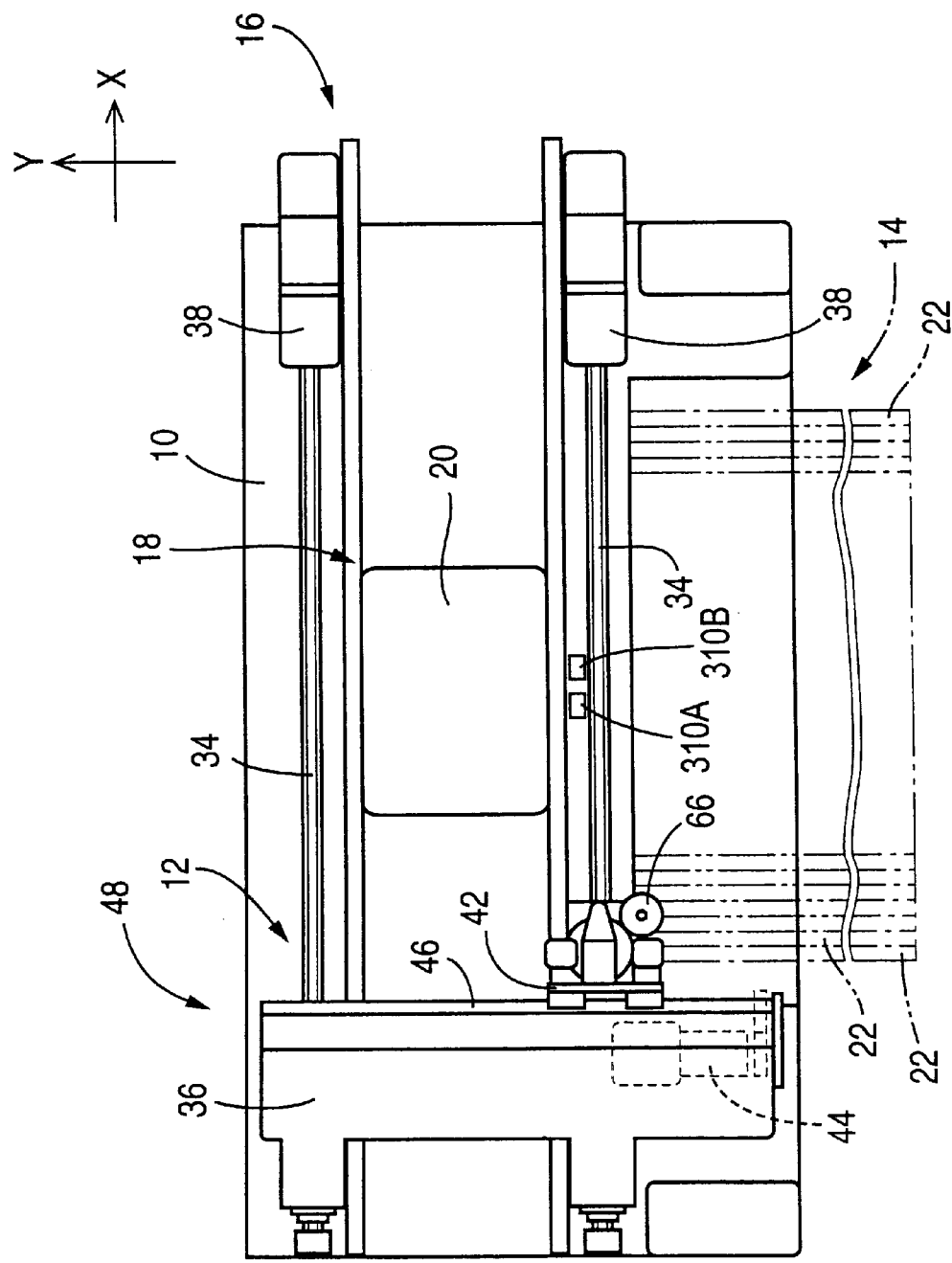
FIG. 6 is a schematic plan view corresponding to FIG. 1, showing another electronic-component mounting system employing two CCD cameras.

However, the single CCD camera 310 may be replaced with two CCD cameras 310A, 310B that provided, on the base 10, at respective different positions between the EC supplying device 14 and the PCB conveying device 16 in the Y direction, shown in FIG. 6. In this case, the ring lamp 320, not shown in FIG. 6, is provided around the CCD camera 310A only, and is fixed to the base 10.

In addition, a nozzle stocker 330 is provided on the base 10 at a position between the EC supplying device 14 and the PCB conveying device 16 in the Y direction. In the present embodiment, the nozzle stocker 330 has the same construction as that of the nozzle stocker disclosed in U.S. patent application Ser. No. 09/234,489. Accordingly, the detailed description and illustration of the nozzle stocker 330 are omitted, and are briefly described below.

Figure 4:
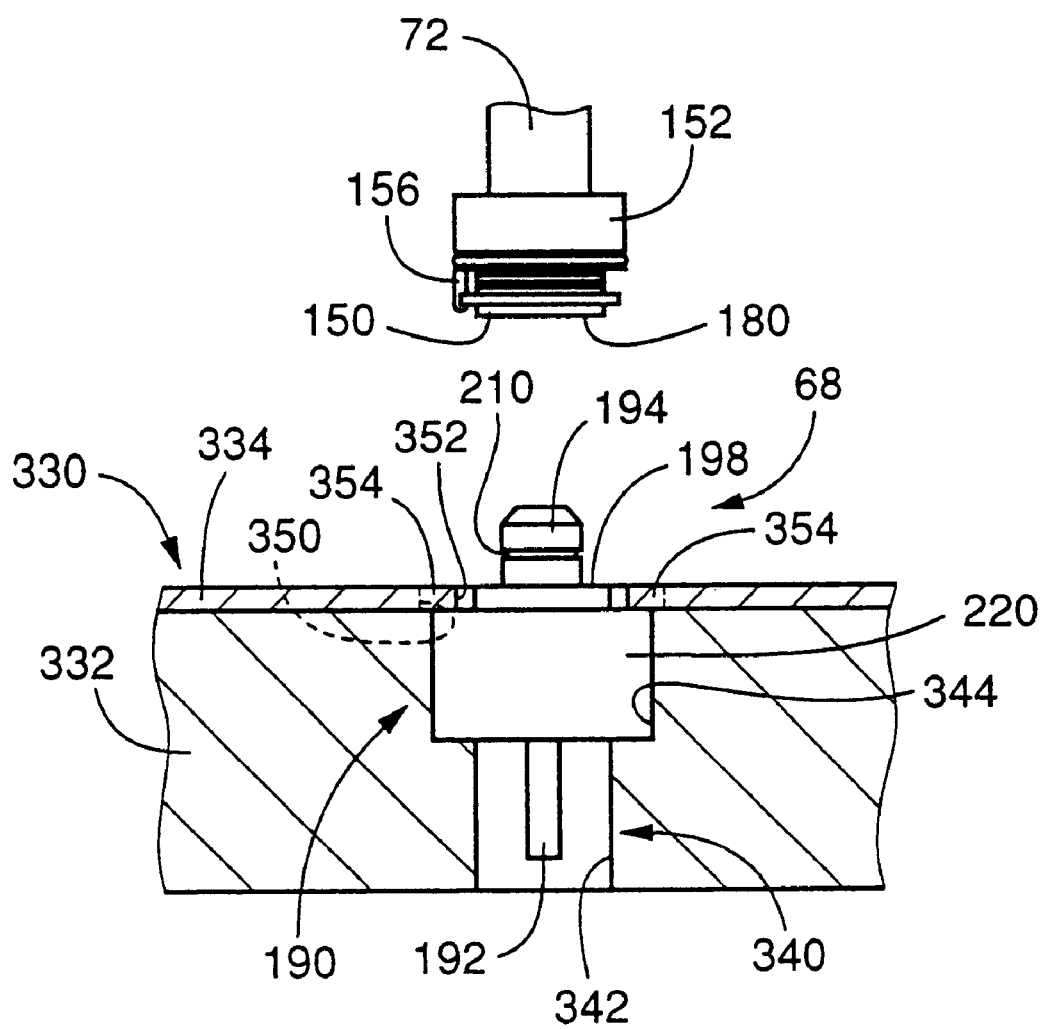
FIG. 4 is a view for explaining the manner in which suction nozzles are exchanged with each other in the EC mounting system of FIG. 1.

As shown in FIG. 4, the nozzle stocker 330 includes a generally plate-like, nozzle holding member 332 and a preventing plate 334. The nozzle stocker 330 stocks or stores a plurality of sorts of suction nozzles 68 (only one nozzle 68 is shown in FIG. 4) including respective suction pipes 192 having different diameters corresponding to different shapes and/or dimensions of ECs 32. The nozzle holding member 332 has a plurality of stepped holding holes 340 (only one hole 340 is shown in FIG. 4) each of which receives one suction nozzle 68. Each holding hole 340 includes a small-diameter portion 342 whose diameter allows a suction pipe 192 having the greatest diameter to fit therein; and a large-diameter portion 344 whose diameter is somewhat greater than that of the block portion 220 of the pipe holder 190.

The preventing plate 334 has a thin plate-like shape and covers the holding holes 340 of the nozzle holding member 332. The plate 334 has a plurality of circular holes 350 (only one hole 350 is shown in FIG. 4), and a plurality of connecting holes 352 each of which connects between adjacent two circular holes 350. Each of the circular holes 350 has a diameter somewhat greater than that of the large-diameter portion 344 of each nozzle holding hole 340. The circular holes 350 are formed at a pitch equal to that at which the nozzle holding holes 340 are formed in the nozzle holding member 332 in each of its lengthwise direction and its widthwise direction perpendicular to the lengthwise direction. Each connecting hole 352 has a width smaller than the diameter of the block portion 220 of the pipe holder 190 of each suction nozzle 68. The width of each connecting hole 352 is defined as a dimension thereof in a direction parallel to a widthwise direction of the preventing plate 334, on a plane parallel to the plane of the plate 334. A pair of projections of the preventing plate 334 that cooperate with each other to define each connecting hole 352 provide preventing portions 354 which prevent each suction nozzle 68 from coming off the nozzle holding member 332. Each pair of preventing portions 354 are distant from, and opposed to, each other in the widthwise direction of the preventing plate 354.

A preventing-plate moving device 360 (FIG. 5) moves the preventing plate 324 relative to the nozzle holding member 332 in the lengthwise direction of the plate 324 or the member 332, to an operative position where the pairs of preventing portions 354 are positioned above the nozzle holding holes 340, respectively, and prevent the suction nozzles 68 from coming off the holes 340, respectively, and to a retracted position where the circular holes 350 are positioned right above the holding holes 340, respectively, and allow the nozzles 68 to be taken away from the holes 340, respectively. The preventing-plate moving device 360 may include an air-pressure-operated cylinder device.

Figure 5:
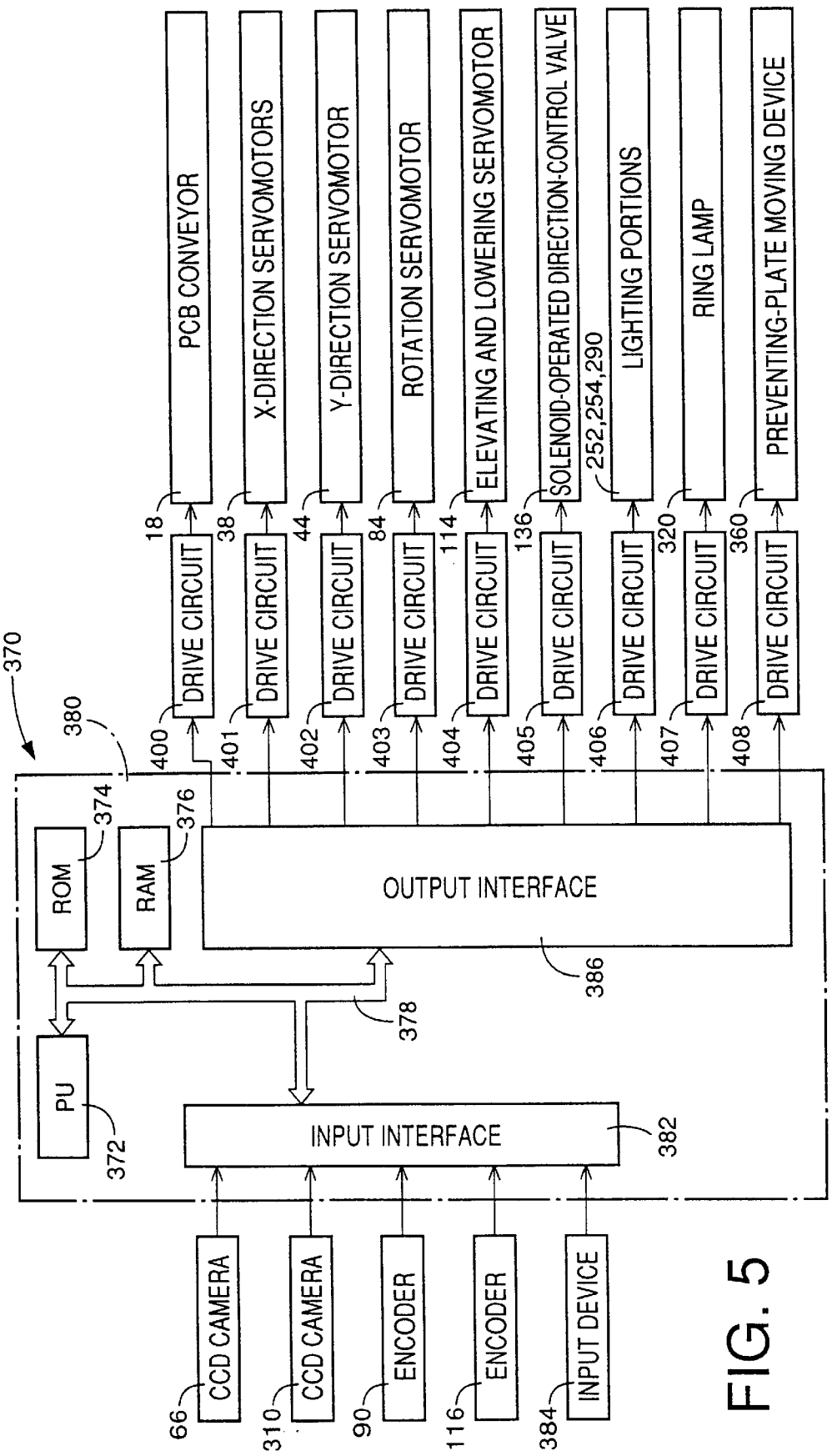
FIG. 5 is a diagrammatic view of a relevant portion of a control device of the EC mounting system of FIG. 1.

The present EC mounting system is controlled by a control device 370 shown in FIG. 5. The control device 370 is essentially provided by a computer 380 including a PU (processing unit) 372, a ROM (read only memory) 374, a RAM (random access memory) 376, and a bus 378 connecting the elements 372, 374, 376 with one another. An input interface 382 is connected to the bus 378, and the CCD cameras 66, 310, the encoders 90, 116, and an input device 384 are connected to the input interface 382. The input device 384 includes a keyboard or an operation panel which is operable by an operator. An output interface 386 is connected to the bus 378 on one hand, and is connected to various drive circuits 400, 401, 402, 403, 404, 405, 406, 407, 408 on the other hand. The PCB conveyor 18, the X-direction servomotors 38, the Y-direction servomotor 44, the rotation servomotor 84, the elevating and lowering servomotor 114, the solenoid-operated direction-control device 136, the three lighting portions 252, 254, 290 (i.e., the tubular lighting portion 252, the flange-like lighting portion 254, the auxiliary lighting portion 290), the ring lamp 320, and the preventing-plate moving device 360 are connected to the drive circuits 401 to 409, respectively. The ROM 374 stores various control programs which are needed to suck (i.e., hold) and mount the EC 32.

In the EC mounting system constructed as described above, the suction nozzle 68 receives the EC 32 from the EC supplying device 14 at the EC-receive position (i.e., the EC-suck position) and mounts the same 32 on the PCB 20 at the EC-mount position. Between the EC-receive position and the EC-mount position, the CCD camera 310 takes a silhouette image or a front-surface image of the EC 32 held by the suction pipe 192. The control device 370 processes image data representing the taken silhouette or front-surface image of the EC 32 and determines the current rotation position of the EC 32 and the X-direction and Y-direction positional errors of the EC 32 held by the suction nozzle 68. The control device 370 corrects the current rotation position of the EC 32 and the X-direction and Y-direction positional errors of the EC 32, by rotating the suction nozzle 68 and stopping the EC holder 30 at corrected X-direction and Y-direction positions. Then, the suction nozzle 68 mounts the EC 32 on the PCB 20.

When the EC holder 30 receives an EC 32 from the EC supplying device 14, the X-direction slide 36 and/or the Y-direction slide 42 are moved to position the suction pipe 192 at a position right above one of the EC-supply cartridges 22 that supplies the EC 32 to be received by the EC holder 30. Then, the elevating and lowering device 62 lowers the EC holder 30 from its downward-movement-start position, so that the suction pipe 192 contacts the upper surface of the EC 32. Although the pipe 192 is further lowered by a small distance after contacting the EC 32, the pipe 192 and the EC 32 are prevented from being broken because the pipe 192 compresses the compression coil spring 158 and moves relative to the spline axis member 72. In this state, the suction pipe 192 is communicated with the vacuum source to suck and hold the EC 32.

Then, the EC holder 30 is elevated, and the X-Y robot 48 is operated to position the suction pipe 192 at the image-take position right above the CCD camera 310, which takes a silhouette or a front-surface image of the EC 32 held by pipe 192. For example, in the case where the EC 32 is of a flat-package type, as shown in FIG. 2, in which lead wires project outward from side surfaces of a main body, the control device 370 chooses taking a silhouette image of the EC 32. When the CCD camera 310 takes a silhouette image of the EC 32, the control device 370 turns on the back-surface lighting device 250 and turns off the ring lamp 320. Thus, the IR rays emitted by the flange-like lighting portion 254 light the back surface of the EC 32, and the light emitted by the tubular lighting portion 252 is deflected to a downward direction by the reflecting surface 232 and then only IR rays are transmitted, and made substantially uniform, by the IR-ray transmitting filter 240, so that the IR rays light the back surface of the EC 32 in the vicinity of the suction pipe 192. In addition, the auxiliary lighting portion 290 emits IR rays toward the gap provided between the suction-pipe holder 190 and the tubular lighting portion 252. Thus, the IR rays emitted by the back-surface lighting device 250 uniformly light the back surface of the EC 32 and its background, and thereby form a silhouette image of the EC 32 on the imaging surface of the CCD camera 310, i.e., the matrix of solid-state imaging elements (i.e., the matrix of CCDs) of the same 310. Since the CCD camera 310 is sensitive to the IR rays, the camera 310 takes a clear silhouette image of the EC 32 with a lighter background.

However, there are some cases where a silhouette image of the EC 32 held by the suction pipe 192 does not provide sufficient information. For example, in the case of a PLCC type EC in which lead wires project from side surfaces of a main body such that respective free end portions of the lead wires are curved like "J" and are located inside an outer peripheral edge of the main body, or in the case of a pin-grid-array (PGA) type EC in which lead wires perpendicularly project from grid or lattice points on a front surface of a main body, the control device 370 chooses taking a front-surface image of the EC 32. As far as the present invention is concerned, the "front" surface of the EC 32 is defined as a surface opposed to the CCD camera 310, and the "back" surface of the EC 32 is defined as a surface opposite to the "front" surface. When the PGA type EC is mounted on the PCB 20, the "front" surface of the EC contacts the PCB 20. When the CCD camera 310 takes a front-surface image of the EC 32, the control device 370 turns on the ring lamp 320 and turns off the back-surface lighting device 250. Thus, the ring lamp 320 emits the visible light toward the front surface of the EC 32 held by the suction pipe 192, and the light reflected by the front surface is incident to the CCD camera 310. Although the CCD camera 310 is sensitive to each of the IR rays and the visible light, the back-surface lighting device 250 is in an off state and does not emit the IR rays. Thus, the CCD camera 310 takes a front-surface image of the EC 32 that is formed by the visible light. When the front surface of the EC 32 is lighted by the visible light emitted by the ring lamp 320, the visible light is also incident to the back-surface lighting device 250 located in rear of the EC 32. However, since the block portion 220, the flange-like lighting portion. 254, and the auxiliary lighting portion 290 are covered by the dark IR-ray transmitting filters 240, 278, 300, almost all the visible light is absorbed by the filters 240, 278, 300, so that the CCD camera 310 can take a light image of the EC 32 with a dark background that is suitable for image-data processing.

The control device 370 receives and processes image data representing the silhouette or front-surface image of the EC 32 taken by the CCD camera 310, or binary data converted from the image data. The control device 370 judges whether the EC 32 held by the suction pipe 192 is of a correct sort to be mounted on the PCB 20, and determines the current rotation position and current X-direction and Y-direction positions of the EC 32 held by the pipe 192. Then, the control device 370 compares the thus determined rotation position and X-direction and Y-direction positions of the EC 32 with respective reference positions pre-stored in the ROM 374, and calculates an angular error, $\delta\theta$, of the EC 32 about the center line thereof (i.e., the center axis line of the suction pipe 192) and X-direction and Y-direction positional errors, $\delta X$ and $\delta Y$, of the center of the EC 32. In the case where the CCD camera 310 takes the front-surface image of the EC 32, the front-surface image may include images of characters and/or a bar code affixed to the front surface of the EC 32. In this case, the control device 370 analyses those images and identifies of what sort the EC 32 is.

While the control device 370 processes the image data or the binary data, the EC 32 is transferred to the EC-mount position. Before the EC 32 reaches the EC-mount position, the control device 370 finishes the processing of the data. Hence, the control device 370 operates the rotation servomotor 84 to rotate the suction pipe 192 for removing the angular error $\delta\theta$, and operates the X-Y robot 48 to move the EC holder 30 to a modified EC-mount position which removes the X-direction and Y-direction positional errors $\delta X$, $\delta Y$. At the modified EC-mount position, the EC 32 held by the suction pipe 192 has a suitable rotation position or phase and suitable X-direction and Y-direction positions, relative to the PCB 20, for being mounted on the PCB 20. Then, the EC holder 30 is lowered, the EC 32 held by the suction pipe 192 is pressed on a predetermined position on the PCB 20, and is fixed to the same 20 by, e.g., adhesion. Subsequently, the solenoid-operated direction-control valve 136 is switched to communicate the suction pipe 192 with the atmosphere and thereby cause the pipe 192 to release the EC 32. Then, the pipe 192 is elevated. Thus, the mounting of one EC 32 on the PCB 20 ends. In the case where the control device 370 detects an excessively bent lead wire of the EC 32, or judges that the EC 32 is not of the sort to be mounted, or in any other case where the control device 370 judges that the EC 32 should not be mounted on the PCB 20, the control device 370 operates the X-Y robot 48 and the EC holder 30 to discard the EC 32 into an EC-collect box (not shown), or takes other appropriate actions. The control device 370 may judge that the EC 32 is not of the sort to be mounted, e.g., if the EC 32 does not assume a posture with which the EC 32 is to be mounted.

When the current suction nozzle 68 held by the holder body 70 of the EC holder 30 is not suitable for holding an EC 32 to be mounted, the current nozzle 68 is exchanged with a suitable nozzle 68 stocked by the nozzle stocker 330. Midway in a movement to pick up the EC 32 from the EC supplying device 14, the EC holder 30 is stopped at a position above the nozzle stocker 330 to exchange the current nozzle 68 with a suitable nozzle 68. In the present embodiment, the current nozzle 68 held by the holder body 70 is returned to its exclusively corresponding holding hole 340 of the nozzle stocker 330. However, the control device 370 may be modified to return the current nozzle 68 to any one of the holding holes 340 each of which can hold the same sort of nozzle 68 as that of the. current nozzle 68, or to any one of all the sorts of holding holes 340 corresponding to all the sorts of nozzles 68, respectively.

The control device 370 stores, in the RAM 376 of the computer 380, data indicating the sort of the current nozzle 68 held by the holder body 70, and data indicating the position of the holding hole 340 which had held the current nozzle 68 but now is empty. Based on those data, the control device 370 moves the holder body 70 to a position right above the empty, holding hole 340. At this timing, the the preventing-plate moving device 360 has moved the preventing plate 334 to its retracted position on the nozzle stocker 330. In this state, the nozzle holding member 332 is elevated by an elevating and lowering device (not shown) and the holder body 70 is lowered by the elevating and lowering device 62, so that the suction pipe 192 of the current nozzle 68 fits into the empty holding hole 340. An excessive downward movement of the holder body 70 is accommodated by the compression of the compression coil spring 158. Subsequently, the preventing plate 334 is moved to its operative position so that one pair of preventing portions 354 are positioned above the upper end surface of the block portion 220 and thereby prevent the nozzle 68 from coming off the holding hole 340. Then, the holder body 70 is elevated toward its uppermost end position and, if the pair of preventing portions 354 apply, to the nozzle 68, a pulling-out force greater than the holding force applied thereto by the spring member 204, the fitting portion 194 of the nozzle 68 is removed from the receiving hole 196 of the adaptor 150, and the returning of the nozzle 68 to the nozzle stocker 330 ends.

After the holder body 70 thus returns the current nozzle 68 to the nozzle stocker 330, the X-Y robot 48 moves the holder body 70 to a position above another nozzle 68 to be used next, as shown in FIG. 4. The holder body 70 is lowered, and the fitting portion 194 of the next nozzle 68 fits into the receiving hole 196 of the adaptor 150, and is held by the spring member 204. Subsequently, the preventing plate 334 is moved to its retracted position and the holder body 70 is elevated to take out the next nozzle 68 from the nozzle stocker 330. Then, the preventing plate 334 is moved to its operative position to prevent all the nozzles 68 from coming off the nozzle holding member 332. Thus, the exchanging of suction nozzles 68 ends. Then, the EC holder 30 is moved to the EC supplying device 14 to take out the EC 32. As described above, the CCD camera 310 provided at the image-take position takes a silhouette or front-surface image of the EC 32. After the positional and angular errors of the EC 32 are corrected, the EC 32 is mounted on the PCB 20.

The current nozzle 68 held by the holder body 70 is exchanged with another nozzle 68 when the current nozzle 68 turns to be defective as a result of use. For example, in the case where the control device 370 judges, based on the image taken by the CCD camera 310, that the current nozzle 68 is not holding an EC 32 or is holding an EC 32 with an abnormal posture, or detects any other EC-holding error, the control device 370 records data indicating the fact, in the RAM 376 of the computer 380. If the detected EC-holding error meets a predetermined criterion or condition, the control device 370 judges that the current nozzle 68 has a defect, such as bending, breakage, or excessive wearing, which leads to the occurrence of EC-holding error, and operates for exchanging the current nozzle 68 with another nozzle 68 as it does when the EC mounting system changes the current sort of ECs 32 to a different sort of ECs 32 to be mounted next on the PCB 20.

As is apparent from the foregoing description, in the present embodiment, the Y-direction slide 42, the EC holder 30, the elevating and lowering device 62, the rotating device 64, the back-surface lighting device 250, the ring lamp 320, etc. cooperate with one another to provide an EC holding apparatus as a sort of holding apparatus; and the Y-direction slide 42 provides a support portion of the holding apparatus. The suction pipe 192 provides a holding portion of the holding apparatus. The holder body 70 including the spline axis member 72 and the adaptor 150 provides a support rod; the adaptor 150 and the spring member 204 cooperate with each other to provide an attaching device which attaches the suction nozzle 68 to the support rod; and the elevating and lowering device 62 provides a support-rod moving device which advances and retracts the support rod in an axial direction thereof. The X-Y robot 48 provides a moving device which moves the holding apparatus; and the CCD camera 310 provides a common image taking device which functions as each of a first and a second image taking device. The block portion 220 of the suction-pipe holder 190 provides a light converting portion; and the reflecting surface 232 provides a tapered reflecting surface. The light emitting diodes of the light emitting bodies 258, 270, 294 provide light emitting elements as a sort of point light sources. The tubular lighting portion 252, the flange-like lighting portion 254, the auxiliary lighting portion 290, and the block portion 220 cooperate with one another to provide a light emitting plate; and the light emitting surfaces 274, 290 of the light emitting bodies 270, 294 and the lower surface 226 of the block portion 220 cooperate with one another to provide a light emitting surface of the light emitting plate. The IR-ray transmitting filters 240, 278, 300 also function as diffusing layers or plates.

In the present embodiment, the CCD camera 310 can takes either a silhouette or a front-surface image of each EC 32 depending upon, e.g., the sort of each EC 32, by just selectively turning on the back-surface lighting device 250 or the ring lamp 320. When the CCD camera 310 takes a silhouette image of an EC 32, the back-surface lighting device 250 is turned on to emit the IR rays to the back surface of the EC 32 held by the suction pipe 192, so that the CCD camera 310 can take an excellent silhouette image of the EC 32 with a sufficiently light background. Meanwhile, when the CCD camera 310 takes a front-surface image of an EC 32, the IR-ray transmitting filters 240, 278, 300 of the back-surface lighting device 250 function as a dark background of the EC 32, so that the CCD camera 310 can take a clear front-surface image of the EC 32. Since the back-surface lighting device 250 need not be moved away from the image-take position when the CCD camera 310 takes a front-surface image, the present holding apparatus can enjoy a simple structure. In addition, since the CCD camera 310 is sensitive to both the IR rays and the visible light, the EC transferring and mounting device 12 can enjoy a simple construction, which contributes to reducing the production cost thereof. Moreover, since the main portion 252, 254, 290 of the back-surface lighting device 250 are separate from the suction nozzle 68, the main portion 252, 254, 290 remains on the holding apparatus, when the current nozzle 68 is exchanged with a different nozzle 6.8, and can be used with the different nozzle 68. This feature contributes to reducing the overall cost needed to run the present EC mounting system. Furthermore, since the suction nozzle 68 can be advanced and retracted lightly, the ECs 32 can be quickly mounted on the PCB 20. In the present embodiment, the elevating and lowering device 62 can be used commonly for moving the suction nozzle 68 to pick tip and mount the EC 32 and for moving the same 68 to exchange the current nozzle 68 with another nozzle 68.

The elevating and lowering device 62 and the rotating device 64 employed in the present embodiment may be replaced with those, disclosed in Japanese Patent Application laid open for inspection purposes under Publication No. 8(1996)-78882, in which a spline axis member as a support rod is connected to a ball screw such that the spline axis member is rotatable relative to the ball screw and is immovable relative to the same in their axial direction, the spline axis member and the ball screw are elevated and lowered as a unit by a Z-axis motor, and the spline axis member is rotated relative to the ball screw by a θ-axis motor. The support-rod moving device may be provided by a fluid-pressure-operated cylinder device or any one of other known suitable devices. The point light sources may be provided by a light emitting body including a number of optical fibers, or any one of other known suitable light sources. The common image taking device may be provided by an array of imaging elements (i.e., "a line sensor").

In the illustrated embodiment, the main portion 252, 254, 290 of the back-surface lighting device 250 and the ring lamp 320 as the front-surface lighting device are attached to the Y-direction slide 42, and thus the Y-direction slide 42 functions as the support portion of the holding apparatus. However, the holder body 70 and the suction nozzle 68 can be regarded as the holding apparatus and the holder body 70 can be regarded as the support portion of the holding apparatus. In the latter case, the main portion 252, 254, 290 of the back-surface lighting device 250 and at least a porton of the front-surface lighting device may be attached to the holder body 70. Alternatively, a member or device corresponding to the holder body 70 may be attached to a movable member or a rotary plate, and the main portion 252, 254, 290 of the back-surface lighting device 250 and the at least porton of the front-surface lighting device may be attached to one of the member or device corresponding to the holder body 70, the movable member, and the rotary plate.

It is to be understood that the present invention may be embodied with various changes, improvements, and modifications that may occur to a person skilled in the art without departing from the scope and spirit of the invention defined in the appended claims.

What is claimed is:

1. A holding apparatus comprising:
   a suction nozzle which applies a negative pressure to a back surface of an object and thereby holds the object;
   a front-surface lighting device which emits a first visible light toward a front surface of the object held by the suction nozzle and thereby lights the front surface of the object so that the first visible light forms an image of the front surface of the object; and
   a back-surface lighting device which lights the back surface of the object held by the suction nozzle and which includes: (a) a light emitting plate which is provided around a base portion of the suction nozzle and emits a second light from a light emitting surface thereof facing a vicinity of a free end of the suction nozzle that holds the object; and (b) a black infrared-ray transmitting filter which covers the light emitting surface of the light emitting plate, and transmits infrared rays of the second light so that the infrared rays light the back surface of the object and thereby forms a silhouette image of the object,
   wherein when the front surface lighting device emits the first visible light toward the front surface of the object, the light emitting plate does not emit the second light, and the black infrared-ray transmitting filter does not transmit the infrared rays, and does not reflect the first visible light, thereby forming a black background of the image of the front surface of the object formed by the first visible light, and
   wherein when the light emitting plate emits the second light, and the black infrared ray transmitting filter transmits the infrared rays, thereby forming the silhouette image of the object, the front-surface lighting device does not emit the first visible light toward the front surface of the object.

2. A holding apparatus according to claim 1, wherein the light emitting plate comprises a plurality of light emitting elements arranged along the light emitting surface thereof, and a diffusing plate which covers the light emitting surface and which diffuses respective lights emitted by the light emitting elements and thereby emits a substantially uniform light.

3. A holding apparatus according to claim 1, further comprising a support portion to which the suction nozzle is detachably attached, the back-surface lighting device including a main portion which is separate from the suction nozzle and is supported by the support portion such that when the suction nozzle is detached from the support portion, the main portion remains supported by the support portion.

4. A holding apparatus according to claim 3, wherein the main portion of the back-surface lighting device comprises a tubular lighting portion which emits, from an inner surface thereof, a first light; and an outer lighting portion which extends outward from the tubular lighting portion and which emits, from one surface thereof, a second light in a direction parallel to a centerline of the tubular lighting portion, and wherein the suction nozzle comprises a light converting portion which is fitable in an inner space of the tubular lighting portion and which converts the first light emitted by the tubular lighting portion into a third light having said direction parallel to the centerline of the tubular lighting portion; and a suction pipe which holds the object and which extends from one end of the light converting portion in said direction parallel to the centerline of the tubular lighting portion, one end portion of the suction nozzle that is opposite to the suction pipe being detachably attached to the support portion.

5. A holding apparatus according to claim 4, wherein at least one of the tubular lighting portion and the outer lighting portion comprises a plurality of light emitting elements which emits respective lights and which are arranged on a plurality of lattice points, respectively; and a diffusing layer which diffuses the lights emitted by the light emitting elements and thereby emits a substantially uniform light.

6. A holding apparatus according to claim 4, wherein the light converting portion comprises a tapered reflecting surface which is coaxial with the suction pipe and whose radius increases in a direction away from a free end of the suction pipe that holds the object.

7. A holding apparatus according to claim 4, wherein the light converting portion comprises a diffusing block which diffuses the first light emitted by the tubular lighting portion and emits the third light from an outer surface thereof located on a side of the suction pipe.

8. A holding apparatus according to claim 4, further comprising:
   a support rod which is supported by the support portion such that the support rod is movable in a direction parallel to an axis line of the suction pipe;
   an attaching device which attaches the suction nozzle to one end portion of the support rod such that the suction nozzle is detachable from the support rod; and
   a support-rod moving device which moves the support rod in a direction parallel to an axis line thereof, thereby moving the light converting portion of the suction nozzle relative to the tubular lighting portion in said direction parallel to the centerline thereof, so that the suction pipe of the suction nozzle is advanceable and retractable in said direction parallel to the axis line thereof.

9. A holding apparatus according to claim 4, wherein the main portion of the back-surface lighting device further comprises an auxiliary lighting portion which is opposed to a gap provided between the tubular lighting portion and the light converting portion and which emits a fourth light toward a side of the suction pipe via the gap.

10. A transferring apparatus comprising:
a holding apparatus including:
  a suction nozzle which applies a negative pressure to a back surface of an object and thereby holds the object;
  a front-surface lighting device which emits a first visible light toward a front surface of the object held by the suction nozzle and thereby lights the front surface of the object, so that the first visible light forms an image of the front surface of the object; and
  a back-surface lighting device which lights the back surface of the object held by the suction nozzle and which includes: (a) a light emitting plate which is provided around a base portion of the suction nozzle and emits a second light from a light emitting surface thereof facing a vicinity of a free end of the suction nozzle that holds the object; and (b) a black infrared-ray transmitting filter which covers the light emitting surface of the light emitting plate, and transmits infrared rays of the second light so that the infrared rays light the back surface of the object and thereby forms a silhouette image of the object;
  wherein when the front-surface lighting device emits the first visible light toward the front surface of the object, the light emitting plate does not emit the second light, and the black infrared-ray transmitting filter does not transmit the infrared rays, and does not reflect the first visible light, thereby forming a black background of the image of the front surface of the object formed by the first visible light,
  wherein when the light emitting plate emits the second light, and the black infrared-ray transmitting filter transmits the infrared rays, thereby forming the silhouette image of the object, the front-surface lighting device does not emit the first visible light toward the front surface of the object;
a moving device which moves the suction nozzle and the back-surface lighting device of the holding apparatus in a direction perpendicular to an axis line of the suction nozzle; and
at least one image taking device which is provided at at least one predetermined position in a range in which the moving device moves the suction nozzle and the back-surface lighting device of the holding apparatus, so that when the suction nozzle and the back-surface lighting device are positioned at the predetermined position, the image taking device is opposed to the suction nozzle and the back-surface lighting device and takes at least one of (a) the silhouette image of the object held by the suction nozzle and (b) the image of the front surface of the object with the black background formed by the black infrared-ray transmitting filter.

11. A transferring apparatus according to claim 10, further comprising:
a nozzle stocker which stocks at least one suction nozzle; and
a nozzle-exchange control device which controls the moving device to move the suction nozzle of the holding apparatus to a position where the suction nozzle of the holding apparatus is opposed to the nozzle stocker, and causes the suction nozzle of the holding apparatus to be exchanged with the one suction nozzle stocked by the nozzle stocker.

12. A transferring apparatus according to claim 10, wherein the image taking device comprises a charge-coupled-device camera.

13. An image taking system comprising:
a front-surface lighting device which emits a first visible light toward a front surface of an object whose back surface is held by a holding portion of a holding device and thereby lights the front surface of the object, so that the first visible light forms an image of the front surface of the object;
a first image taking device which is sensitive to the first visible light and takes the image of the front surface of the object being lighted by the front-surface lighting device;
a back-surface lighting device which is provided in back of the object held by the holding portion of the holding device, which lights the back surface of the object held by the holding portion, and which includes: (a) a light emitting plate which emits a second light from a light emitting surface thereof facing a vicinity of the holding portion holding the back surface of the object; and (b) a black infrared-ray transmitting filter which covers the light emitting surface of the light emitting plate, and transmits infrared rays of the second light so that the infrared rays light the back surface of the object and thereby forms a silhouette image of the object, wherein when the front-surface lighting device emits the first visible light toward the front surface of the object, the black infrared-ray transmitting filter does not reflect the first visible light and thereby forms a black background of the image of the front surface of the object formed by the first visible light; and
a second image taking device which is sensitive to the infrared rays and takes the silhouette image of the object being lighted by the back-surface lighting device, wherein the second image taking device is provided, on a plane substantially parallel to the front and back surfaces of the object held by the holding portion of the holding device, at a position different from a position where the first image taking device is provided.

14. An image taking system, comprising:
a front-surface lighting device which emits a first visible light toward a front surface of an object whose back surface is held by a holding portion of a holding device and thereby lights the front surface of the object, so that the first visible light forms an image of the front surface of the object;
an image taking device which is sensitive to the first visible light and takes the image of the front surface of the object being lighted by the front-surface lighting device; and
a back-surface lighting device which is provided in back of the object held by the holding portion of the holding device, which lights the back surface of the object held by the holding portion, and which includes (a) a light emitting plate which emits a second light from a light emitting surface thereof facing a vicinity of the holding portion holding the back surface of the object; and (b) a black infrared-ray transmitting filter which covers the light emitting surface of the light emitting plate, and transmits infrared rays of the second light so that the infrared rays light the back surface of the object and thereby forms a silhouette image of the object,
wherein when the front-surface lighting device emits the first visible light toward the front surface of the object, the light emitting plate does not emit the second light, and the black infrared-ray transmitting filter does not transmit the infrared rays, and does not reflect the first visible light, thereby forming a black background of the image of the front surface of the object formed by the first visible light, wherein when the light emitting plate emits the second light, and the black infrared-ray transmitting filter transmits the infrared rays, thereby forming the silhouette image of the object, the front-surface lighting device does not emit the first visible light toward the front surface of the object, and wherein the image taking device is sensitive to the infrared rays and takes the silhouette image of the object being lighted by the back-surface lighting device.

15. An image taking system according to claim 14, wherein the image taking device comprises a charge-coupled-device camera.

16. A method of taking an image of an object which is held by a holding device, comprising the steps of providing, in front of the object whose back surface is held by a holding portion of the holding device, a front-surface lighting device which emits a first visible light toward a front surface of the object and thereby lights the front surface of the object, so that the first visible light forms an image of the front surface of the object, providing, in back of the object held by the holding portion of the holding device, a back-surface lighting device which lights the back surface of the object held by the holding portion and which includes: (a) a light emitting plate which emits a second light from a light emitting surface thereof facing a vicinity of the holding portion holding the back surface of the object; and (b) a black infrared-ray transmitting filter which covers the light emitting surface of the light emitting plate, and transmits infrared rays of the second light so that the infrared rays light the back surface of the object and thereby forms a silhouette image of the object, wherein when the front-surface lighting device emits the first visible light toward the front surface of the object, the black infrared-ray transmitting filter does not reflect the first visible light and thereby forms a black background of the image of the front surface of the object formed by the first visible light, operating the front-surface light device and a first image taking device which is sensitive to the first visible light, to take, in the black background formed by the black infrared-ray transmitting filter, the image of the front surface of the object that is lighted by the front-surface lighting device; and operating the back-surface lighting device and a second image taking device which is sensitive to the infrared rays of the second light and is provided, on a plane substantially parallel to the front and back surfaces of the object held by the holding portion of the holding device, at a position different from a position where the first image taking device is provided, to take the silhouette image of the object whose back surface is lighted by the back-surface lighting device.

17. A method of taking an image of an object which is held by a holding device, comprising the steps of:

providing, in front of the object whose back surface is held by a holding portion of the holding device, a front-surface lighting device which emits a first visible light toward a front surface of the object and thereby lights the front surface of the object, so that the first visible light forms an image of the front surface of the object, providing, in back of the object held by the holding portion of the holding device, a back-surface lighting device which lights the back surface of the object held by the holding portion and which includes: (a) a light emitting plate which emits a second light from a light emitting surface thereof facing a vicinity of the holding portion holding the back surface of the object; and (b) a black infrared-ray transmitting filter which covers the light emitting surface of the light emitting late, and transmits infrared rays of the second light so that the infrared rays light the back surface of the object and thereby forms a silhouette image of the object, wherein when the front-surface lighting device emits the first visible light toward the front surface of the object, the light emitting plate does not emit the second light, and the black infrared-ray transmitting filter does not transmit the infrared rays, and does not reflect the first visible light, thereby forming a black background of the image of the front surface of the object formed by the first visible light, wherein when the light emitting plate emits the second light, and the black infrared-ray transmitting filter transmits the infrared rays, thereby forming the silhouette image of the object, the front-surface lighting device does not emit the first visible light toward the front surface of the object, operating the front-surface lighting device and an image taking device which is sensitive to the first visible light, to take, in the black background formed by the black infrared-ray transmitting filter, the image of the front surface of the object that is lighted by the front-surface lighting device, and operating the back-surface lighting device and the image taking device which is sensitive to the infrared rays of the second light, to take the silhouette image of the object whose back surface is lighted by the back-surface lighting device.

* * * * *